(12) United States Patent
Jung et al.

(10) Patent No.: US 6,996,138 B2
(45) Date of Patent: Feb. 7, 2006

(54) FABRY-PEROT LASER APPARATUS MODE-LOCKED TO MULTI-FREQUENCY LASING LIGHT SOURCE AND OPTICAL TRANSMISSION APPARATUS USING THE SAME

(75) Inventors: Dae-Kwang Jung, Suwon-shi (KR); Tae-Sung Park, Suwon-shi (KR); Yun-Je Oh, Yongin-shi (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 266 days.

(21) Appl. No.: 10/638,842

(22) Filed: Aug. 11, 2003

(65) Prior Publication Data

US 2004/0101305 A1 May 27, 2004

(30) Foreign Application Priority Data

Nov. 21, 2002 (KR) ................ 10-2002-0072793

(51) Int. Cl.
*H04J 14/00* (2006.01)
*G02B 6/28* (2006.01)

(52) U.S. Cl. .............................. 372/18; 359/156; 385/24
(58) Field of Classification Search ................... 372/18; 359/156; 385/24
See application file for complete search history.

(56) References Cited

U.S. PATENT DOCUMENTS

| | | | | | |
|---|---|---|---|---|---|
| 5,283,686 | A | * | 2/1994 | Huber | ......................... 359/337 |
| 6,204,944 | B1 | * | 3/2001 | Uchiyama et al. | ............. 398/79 |
| 6,256,432 | B1 | * | 7/2001 | Jeon et al. | ..................... 385/24 |
| 6,532,091 | B1 | * | 3/2003 | Miyazaki et al. | ............ 398/175 |
| 6,771,854 | B2 | * | 8/2004 | Matsuoka et al. | ............. 385/24 |
| 6,813,447 | B2 | * | 11/2004 | Ellis et al. | .................... 398/155 |
| 6,873,797 | B2 | * | 3/2005 | Chang et al. | .................. 398/51 |
| 2001/0004290 | A1 | | 6/2001 | Lee et al. | |

FOREIGN PATENT DOCUMENTS

EP 0060033 2/1982

OTHER PUBLICATIONS

"A Low-Cost WDM Source with an ASE Injected Fabry-Perot Semiconductor Laser," Hyun-Deok Kim et al.; IEEE Photonics Technology Letters, vol. 12, No. 8, Aug. 2000; 3 pgs.

* cited by examiner

*Primary Examiner*—James Vannucci
(74) *Attorney, Agent, or Firm*—Cha & Reiter, LLC.

(57) ABSTRACT

The present invention relates to Wavelength Division Multiplexing (WDM) based optical communications, and more particularly to an Fabry-Perot (FP) laser apparatus mode-locked to a multi-frequency lasing light source and an optical transmission apparatus using the same. An FP laser apparatus mode-locked to a multi-frequency lasing light source, comprises an optical amplifier that amplifies inputted optical signals, a laser light source that wavelength division demultiplexes part of the inputted optical signals, multiplexes the demultiplexed optical signals, re-transmits the multiplexed optical signals, wavelength division demultiplexes the remaining part of the amplified optical signals, and outputs signals mode-locked to the demultiplexed signals, and a first circulator that inputs the remaining part of the amplified optical signals into the laser light source, and outputs, to an optical transmission link, optical signals mode-locked to the multi-frequency lasing light source outputted from the laser light source.

17 Claims, 8 Drawing Sheets

OPTICAL SPECTRUM OF FP LASER

OPTICAL SPECTRUM OF INCOMING SIGNAL

OPTICAL SPECTRUM OF MODE-LOCKED FP LASER

FABRY-PEROT LASER APPARATUS MODE-LOCKED TO MULTI-FREQUENCY LASING LIGHT SOURCE AND OPTICAL TRANSMISSION APPARATUS USING THE SAME

CLAIM OF PRIORITY

This application claims priority to an application entitled "FABRY-PEROT LASER APPARATUS MODE-LOCKED TO MULTI-FREQUENCY LASING LIGHT SOURCE AND OPTICAL TRANSMISSION APPARATUS USING THE SAME," filed in the Korean Intellectual Property Office on Nov. 21, 2002 and assigned Ser. No. 2002-72793, the contents of which are hereby incorporated by reference.

BACKGROUND OF THE INVENTION

1. Field of the Invention

The present invention relates to a Fabry-Perot laser apparatus mode-locked to a multi-frequency lasing light source capable of implementing a cost-effective light source used for optical communications based on Wavelength Division Multiplexing (WDM) without a high-priced external modulator and an optical transmission apparatus using the Fabry-Perot laser apparatus mode-locked to the multi-frequency lasing light source.

2. Description of the Related Art

Conventionally, a Passive Optical Network (PON) based on WDM provides very high speed broadband communication services using a specific wavelength allocated to each subscriber. Accordingly, communication security can be ensured, and a specific communication service or an extension of communication capacity that the subscriber needs can be readily accommodated. Moreover, a specific wavelength can be allocated to a new subscriber and hence the number of subscribers can be increased. In spite of the above-described advantages, because a Central Office (CO) and each subscriber site need a light source for a specific wavelength and an additional wavelength stabilizing circuit for stabilizing a wavelength of the light source, subscriber costs are too high. For this reason, the PON based on the WDM is not commercialized. To implement the PON based on the WDM, the development of a cost-effective WDM-based light source is required.

A PON based on the WDM using a Distributed FeedBack (DFB) laser array, an Multi-Frequency Laser (MFL), a spectrum-sliced light source, an Fabry-Perot (FB) laser mode-locked to incoherent light as the WDM-based light source has been proposed. However, processes for manufacturing the DFB laser array and the MFL are complicated, and the DFB laser array and the MFL for precision wavelength selectivity and wavelength stabilization of the WDM-based light source are high-priced devices.

A spectrum-sliced light source being actively researched can provide the increased number of wavelength division channels by spectrum-slicing optical signals having wide bandwidth using an optical filter or a Waveguide Grating Router (WGR). Thus, a light source for a specific wavelength and equipment for wavelength stabilization are not needed. There are proposed an Light Emitting Diode (LED), an Super-Luminescent Diode (SLD), an FP laser, a fiber amplifier light source, a ultra short pulse light source, etc. as WDM-based light sources. The LED and the SLD proposed as the WDM-based light sources provide very wide optical bandwidth and are inexpensive. However, because the LED and the SLD provide relatively narrower modulation bandwidth and relatively lower output power, they are appropriate as light sources for upstream signals, which are modulated at a lower rate than downstream signals. The FP laser is an inexpensive and high-power device, but cannot provide the increased number of wavelength division channels because of the FP laser's narrow bandwidth. Moreover, when the spectrum-sliced signal outputted by the FP laser is modulated,there is a problem of degradation of performance due to mode partition noise. The ultra short pulse light source has a very wide spectral band and coherence, but has lower stability and pulse width of only several ps. It is thus difficult to implement the microwave pulse light.

A spectrum-sliced fiber amplifier light source has been proposed that is capable of spectrum-slicing Amplified Spontaneous Emission (ASE) light generated from an optical fiber amplifier and providing the increased number of high-power wavelength division channels, in place of the above-described light sources. However, the spectrum-sliced light source requires a high-priced external modulator such as a $LiNbO_3$ modulator so that respective channels transmit different data.

On the other hand, the FP laser mode-locked to incoherent light is used for transmitting mode-locked signals outputted by injecting spectrum-sliced signals into the FP laser with no isolator after spectrum-slicing optical signals of wide bandwidth generated from the incoherent light source such as the LED or the fiber amplifier light source using the optical filter or the WGR. Where the spectrum-sliced signals of predetermined output power or more are injected into the FP laser, the FP laser generates and transmits only signals of a wavelength equal to a wavelength of the injected spectrum-sliced signals. The FP laser mode-locked to incoherent light directly modulates FP laser light on a data signal basis, thereby performing cost-effective data transmission. However, in order to output the mode-locked signals appropriate for long-distance transmission at high speed, the spectrum-sliced signal injected into the FP laser must behigh-power optical signals of wide bandwidth. Moreover, where the incoherent light of bandwidth wider than a mode interval of output signals of the FP laser is injected to transmit high-speed data, the output signals of the mode-locked FP laser have signals of a plurality of wavelengths distributed on the basis of the mode intervals. In this case, long-distance transmission cannot be implemented due to the effect of dispersion of an optical fiber.

SUMMARY OF THE INVENTION

Therefore, the present invention provides a Fabry-Perot laser apparatus mode-locked to a multi-frequency lasing light source capable of implementing a cost-effective light source for use in optical communications based on WDM without a high-priced external modulator.

The present invention also provides a WDM-based optical transmission apparatus using a Fabry-Perot laser mode-locked to a multi-frequency lasing light source.

In accordance with one aspect of the present invention, an FP laser apparatus is provided that is mode-locked to a multi-frequency lasing light source as a light source for WDM-based optical communications, comprising: an optical amplifier for amplifying inputted optical signals; a laser light source for performing wavelength division demultiplexing for part of the inputted optical signals, multiplexing the demultiplexed optical signals, re-transmitting the multiplexed optical signals, performing wavelength division demultiplexing for the remaining part of the amplified optical signals, and outputting signals mode-locked to the demultiplexed signals; and a first circulator for inputting the remaining part of the amplified optical signals into the laser light source, and outputting, to an optical transmission link, optical signals mode-locked to the multi-frequency lasing light source outputted from the laser light source.

In accordance with another aspect of the present invention, an optical transmission apparatus is provided for transmitting upstream and downstream signals of a PON in which a central office, a remote node and a plurality of subscriber devices are connected through a transmission optical fiber. The central office includes a light source having at least one FP laser that outputs for transmission a first plurality of optical signals mode-locked to a multi-frequency lasing light and directly modulated based on downstream data, a circulator connected to the light source that downstream-transmits the first plurality of output signals mode-locked to the multi-frequency lasing light and directly modulated, and outputs a second plurality of optical signals for upstream-transmission from the remote node to the transmission optical fiber, a plurality of upstream optical receivers that receive the upstream-transmitted second plurality of optical signals, a plurality of first wavelength division multiplexers/demultiplexers that multiplexes/demultiplexes an input/output signal of the FP lasers and upstream channels inputted into the upstream optical receivers, a pumping light source that outputs pumping light of a predetermined wavelength to drive the upstream multi-frequency lasing light source, and a second and third wavelength division multiplexer/demultiplexer that multiplexes/demultiplexes the upstream/downstream-transmitted signals and a pumping signal. The remote node includes a multi-frequency lasing light source having an N×N waveguide grating router that demultiplexes the transmitted multiplexed downstream signals transmitted and the multi-frequency lasing light and multiplexes optical signals transmitted from the subscriber devices, and a fourth and fifth wavelength division multiplexer/demultiplexer that multiplexes/demultiplexes the upstream/downstream-transmitted signals and the pumping signal. The subscriber devices each includes an FP laser that receives the optical signals transmitted from the remote node and outputs directly modulated mode-locked signals based on transmitted upstream data, a downstream optical receiver that receives downstream channel signals demultiplexed and transmitted by the remote node, and a sixth wavelength division multiplexer/demultiplexer that multiplexes/demultiplexes input/output signals of the FP laser and downstream channels that are inputted into the downstream optical receiver.

BRIEF DESCRIPTION OF THE DRAWINGS

The above features and other advantages of the present invention will be more clearly understood from the following detailed description taken in conjunction with the accompanying drawings, in which.

DETAILED DESCRIPTION OF THE PREFERRED EMBODIMENTS

Figure 1:
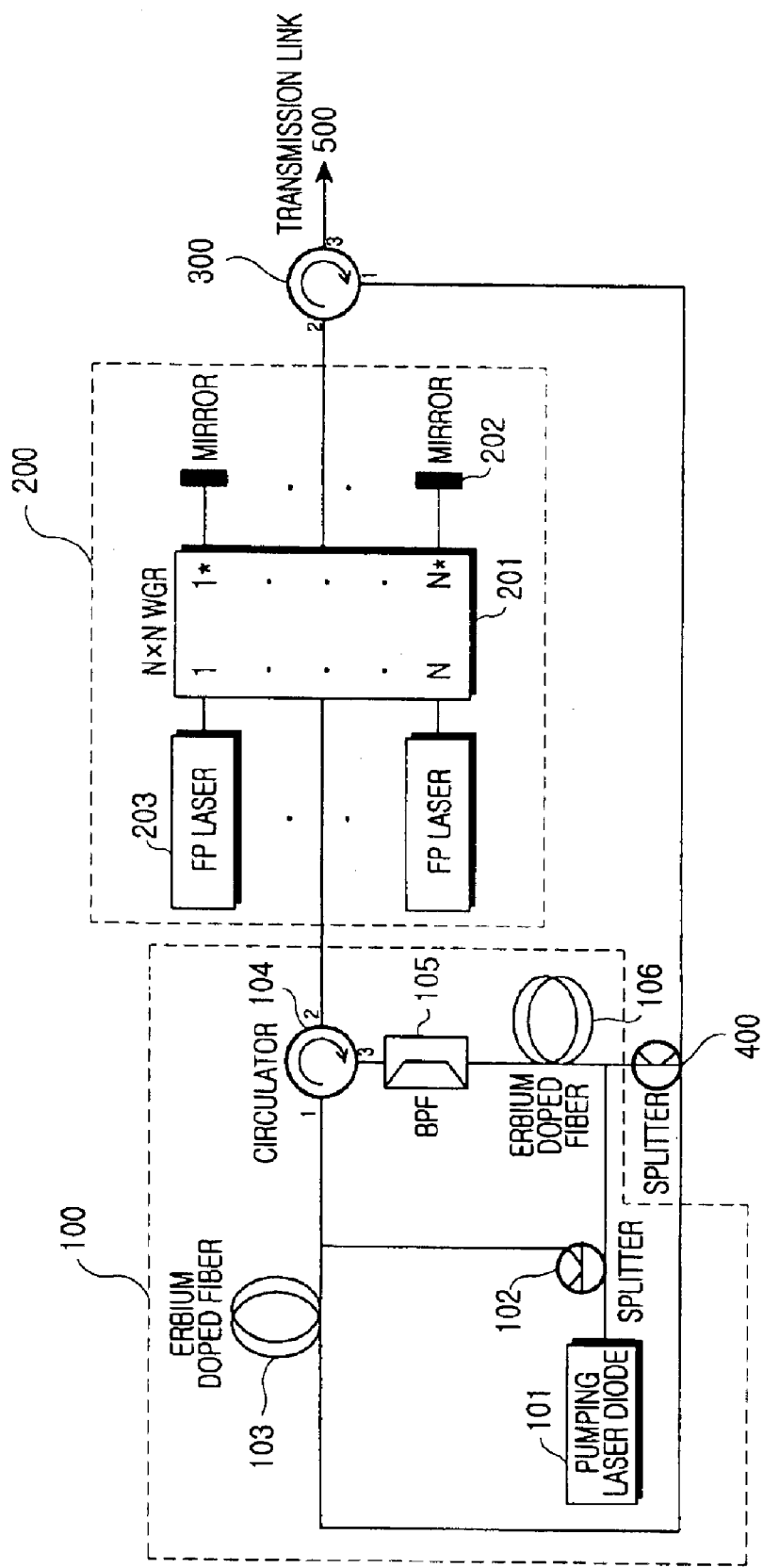
FIG. 1 is illustrates a configuration of an Fabry-Perot (FP)laser apparatus mode-locked to a multi-frequency lasing light source in accordance with a first embodiment of the present invention.

FIG. 1 illustrates a configuration of an FP laser apparatus mode-locked to a multi-frequency lasing light source, in accordance with a first embodiment of the present invention. The FP laser apparatus mode-locked to the multi-frequency lasing light source performs a function of outputting wavelength division multiplexed optical signals to an optical transmission link 500, and includes an optical signal amplifier 100, a laser light source 200, a first optical circulator 300 and a first splitter 400.

The optical signal amplifier 100 amplifies circulated optical signals, and includes a pumping light source 101, a second splitter 102, first and second amplifying fibers 103 and 106, a second circulator 104 and a BandPass Filter (BPF) 105.

The pumping light source 101 outputs a predetermined wavelength of pumping light for pumping the first and second amplifying fibers 103 and 106. The pumping light source 101 according to a preferred embodiment employ a laser diode.

The second splitter 102 partially splits the pumping light and couples the partially split pumping light to the first amplifying fiber 103. The second splitter 102 couples the remaining pumping light to the second amplifying fiber 106. Because the second splitter 102 couples the pumping light to back stages of the first and second amplifying fibers 103 and 106, the first and second amplifying fibers 103 and 106 are pumped backwardly or in a reverse direction.

The first and second amplifying fibers 103 and 106 are pumped by the pumping light source 101, and amplify the circulated optical signals using stimulated emission of a rare earth element. In a preferred embodiment, the first and second amplifying fibers 103 and 106 employ Erbium Doped Fibers (EDFs).

The second circulator 104 includes first, second and third ports, and optical signals inputted into the first port, which are amplified by the first amplifying fiber 103 are outputted to the laser light source 200 through the second port. Optical signals inputted from the laser light source 200 through the second port are outputted to the BPF 105 through the third port.

The BPF 105 is arranged between the second circulator 104 and the second amplifying fiber 106, and has the same bandwidth as the circulated optical signals, thereby removing signals outside of the bandwidth. After removing the signal outside of the bandwidth, the optical signals are amplified by the second amplifying fiber 106, thereby efficiently increasing output power of the optical signals. Further, the BPF 105 restricts a spectral band of the FP laser to within a band corresponding to less than or equal to a free spectral range of a Waveguide Grating Router (WGR) so that a spectrum of each spectrum-sliced signal is in only one wavelength, thereby preventing transmission performance degradation due to an effect of dispersion of an optical fiber and enabling long-distance transmission of high-speed data.

Referring to FIG. 1, the laser light source 200 receives part of optical signals amplified by the optical signal amplifier 100, performs wavelength division demultiplexing for the part of the optical signals, performs wavelength division multiplexing for the demultiplexed part of the optical signals, and re-transmits the multiplexed part of the optical signals to the optical signal amplifier 100. The laser light source 200 receives the remaining part of the amplified optical signals, performs wavelength division demultiplexing for the remaining part of the amplified optical signals, and performs a function of outputting signals mode-locked to the demultiplexed signals. The laser light source 200 includes a plurality of FP lasers 203.

Figure 2A:
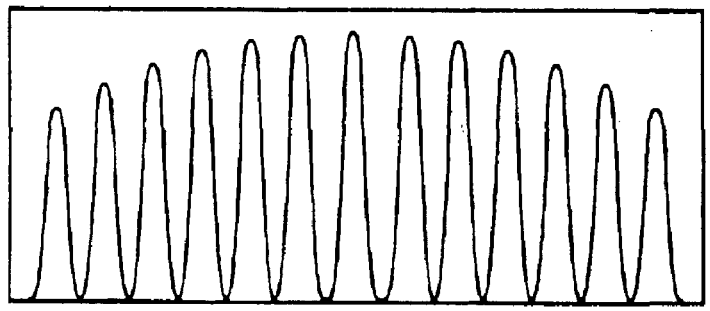
FIGS. 2A to 2C illustrate a mode lock phenomenon of an FP laser.
Figure 2B:
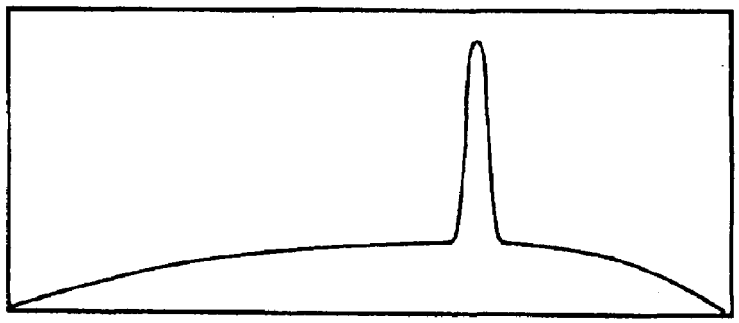
Figure 2C:
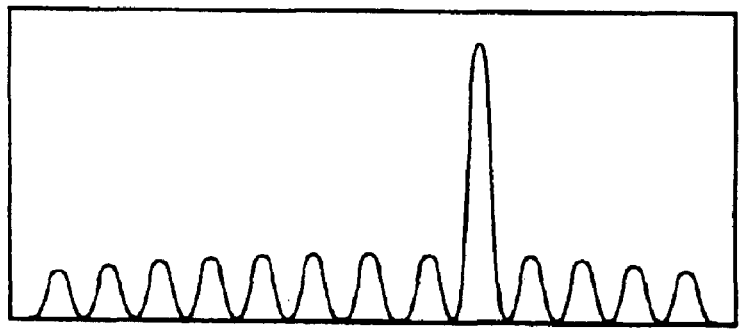

FIGS. 2A to 2C illustrate a mode lock phenomenon of an FP laser. FIG. 2A illustrates a light spectrum before the mode lock phenomenon of the FP laser occurs. FIG. 2B illustrates a light spectrum of an external optical signal inputted into the FP laser, and FIG. 2C shows a light spectrum of the FP laser mode-locked to the inputted external optical signal.

As shown in FIG. 2A, the FP laser, different from a Distributed FeedBack (DFB) laser outputting a single wavelength, outputs a plurality of wavelengths that are arranged at regular intervals, having one wavelength as a central wavelength on the basis of gain characteristics of a resonance wavelength and a fabrication material of a laser diode. When an external optical signal illustrated in FIG. 2B is inputted, a wavelength of the FP laser not mode-locked to the external optical signal is suppressed and only a wavelength of the FP laser is amplified and outputted as illustrated in FIG. 2C. The FP laser having output characteristics as illustrated in FIG. 2C is referred to as "a mode-locked FP laser". As a light source of the external signal, an EDF amplifier, a Light Emitting Diode (LED), an Super-Luminescent Diode (SLD), a DFB laser, an FP laser or etc. can be employed. An intensity difference between the amplified and outputted wavelength and the suppressed wavelength is expressed as an Side Mode Suppression Ratio (SMSR). As the SMSR is increased, transmission performance degradation due to mode division noise generated in the FP laser and an effect of dispersion of an optical fiber are reduced. The mode-locked FP laser directly performs modulation based on a data signal basis, thereby performing cost-effective long-distance transmission of high-speed data. In order to ensure a high SMSR so that the long-distance transmission of high-speed data can be appropriately performed, in a preferred embodiment, a high-power signal or a signal of very narrow line width, such as an output signal of the DFB laser, is inputted into the FP laser.

The laser light source 200 includes an N×N wavelength division multiplexer/demultiplexer 201, N-1 reflection mirrors 202 and N-1 FP lasers 203.

The wavelength division multiplexer/demultiplexer 201 is connected between the second port of the second circulator 104 and the first circulator 300, and each of a first side and a second side of the wavelength division multiplexer/demultiplexer 201 includes one multiplexing port and N-1 demultiplexing ports. The wavelength division multiplexer/demultiplexer 201 receives the part of the optical signals amplified by the optical signal amplifier 100, from the first-side multiplexing port through the second port of the second circulator 104, performs wavelength division demultiplexing for the part of the amplified optical signals, and outputs the demultiplexed signals to the second-side demultiplexing ports. The optical signals inputted into the second-side demultiplexing ports are outputted to the first-side multiplexing port. Similarly, the wavelength division multiplexer/demultiplexer 201 receives the remaining parts of the optical signals, amplified by the optical signal amplifier 100, from the second-side multiplexing port through the second port of the first circulator 300, performs wavelength division demultiplexing for the remaining parts of the amplified optical signals, and outputs the demultiplexed signals to the first-side demultiplexing ports. The wavelength division multiplexer/demultiplexer 201 performs wavelength division multiplexing for the optical signals inputted into the N-1 demultiplexing ports. The wavelength division multiplexer/demultiplexer 201 can employ the WGR.

The respective reflection mirrors 202 are connected to the N-1 demultiplexing ports arranged at the second side, reflect the demultiplexed signals outputted to the second-side demultiplexing ports, and re-input the reflected demultiplexed signals into the second-side demultiplexing ports.

The FP lasers 203 are connected to the N-1 demultiplexing ports arranged at the first side, and output mode-locked signals based on a mode lock by the demultipiexed signals inputted through the demultiplexing ports.

The first circulator 300 is connected to the second-side multiplexing port of the wavelength division multiplexer/demultiplexer 201, outputs the part of the optical signals amplified by the optical signal amplifier 100 inputted through the first port to the second-side demultiplexing ports of the wavelength division multiplexer/demultiplexer 201 through the second port, and outputs the mode-locked signals inputted through the second port from the multiplexing port of the wavelength division multiplexer/demultiplexer 201 to the transmission link 500 through the third port.

The first splitter 400 is connected between the optical signal amplifier 100 and the first port of the first circulator 300, partially splits the optical signals amplified by the optical signal amplifier 100, couples the split optical signals to the first amplifying fiber 103, and inputs the remaining optical signals into the first port of the first circulator 300.

An operation of the laser apparatus with the above-described configurations is now described.

Amplified Spontaneous Emission (ASE) noise with a wide spectral band generated by the first-stage erbium-doped fiber amplifier 103 is inputted into the N×N WGR 201 connected to the second port through the first port of the circulator 104 to be spectrum-sliced and demultiplexed. N-1 spectrum-sliced channels are reflected by the mirror 202 and then re-inputted into the WGR 201. After multiplexing, the multiplexed channels are outputted to the BPF 105 connected to the third port through the second port of the circulator 104. A spectral band of a multiplexed optical signal is limited by the BPF 105 having the same passband as one free spectral range of the WGR 201 for spectrum slicing. The multiplexed signal of the limited spectral band is amplified by the second-stage erbium-doped fiber amplifier 106, and inputted into the splitter 400. Through the splitter 400, part of the multiplexed signals is inputted into the first-stage erbium-doped fiber amplifier 103, and the remaining multiplexed signals are inputted into the WGR 201 connected to the second port through the first port of the circulator 300.

After the multiplexed signals inputted into the first-stage erbium-doped fiber amplifier 103 are amplified, the amplified signals are repeatedly processed through "the circulator 104→the WGR 201→the mirror 202→the WGR 201→the circulator 104→the BPF 105→the erbium-doped fiber amplifier 106→the splitter 400. The multiplexed signals, having very narrow line-width of high output power, are generated. This light source is referred to as a multi-frequency lasing light source.

The remaining multiplexed signals outputted from the splitter 400 are inputted into the WGR 201 connected to the second port through the first port of the circulator 300 to be demultiplexed. Respective demultiplexed channels are inputted into the FP lasers 203, which output signals mode-locked to the inputted channels. The mode-locked signals are inputted into the WGR 201 to be multiplexed, and the multiplexed signals are then outputted to the optical transmission link 500 connected to the third port through the second port of the circulator 300. The FP laser 203 directly performs modulation based on a high-speed data signal to be transmitted without use of a high-priced external modulator.

Figure 3:
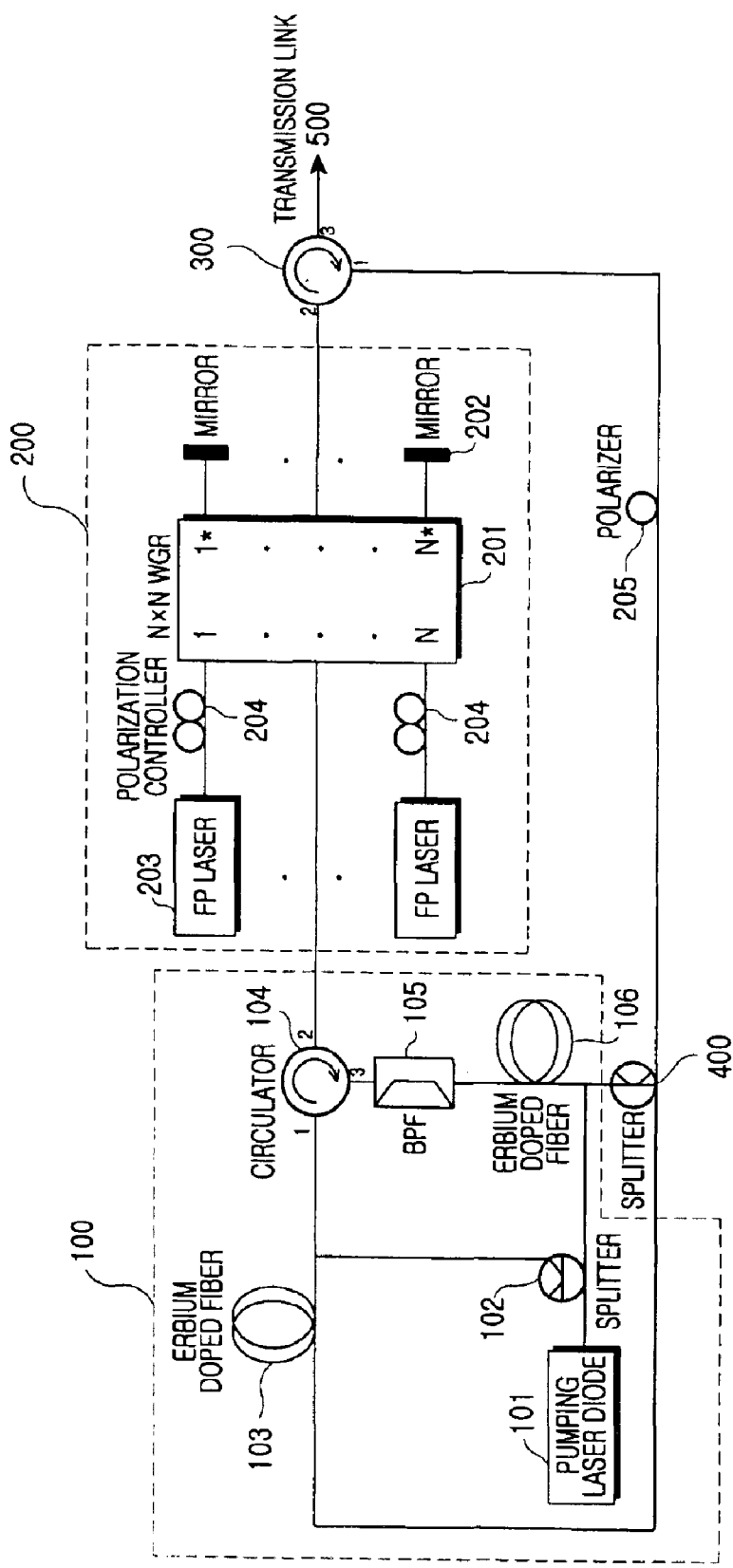
FIG. 3 illustrates a configuration of an FP laser apparatus mode-locked to a multi-frequency lasing light source in accordance with a second embodiment of the present invention.

FIG. 3 illustrates a configuration of an FP laser apparatus mode-locked to a multi-frequency lasing light source in accordance with a second embodiment of the present invention. As compared to the FP laser apparatus illustrated in FIG. 1, the FP laser apparatus illustrated in FIG. 3 further comprises Polarization Controllers (PCs) 204 and a polarizer 205. The PCs 204 are arranged between the FP lasers 203 and the wavelength division multiplexer 201, and the polarizer 205 is arranged between the circulator 300 and the splitter 400. Each FP laser 203 is configured so that a mode-locked signal having a higher SMSR can be outputted from a lower-power input signal, by improving the mode lock efficiency of the FP laser 203. After bias current greater than or equal to a threshold current value is applied to the FP laser 203, if a PC 204 is adjusted and an optical signal having the same polarized light as a signal outputted from the FP laser 203 is inputted into the FP laser 203, the efficiency of a mode lock of the FP laser 203 is improved. Although a relative lower-power optical signal is inputted, the SMSR required for long-distance transmission at high speed can be ensured for a mode-locked signal outputted from the FP laser 203.

An embodiment of the FP laser apparatus mode-locked to the multi-frequency lasing light source is now described.

Figure 4:
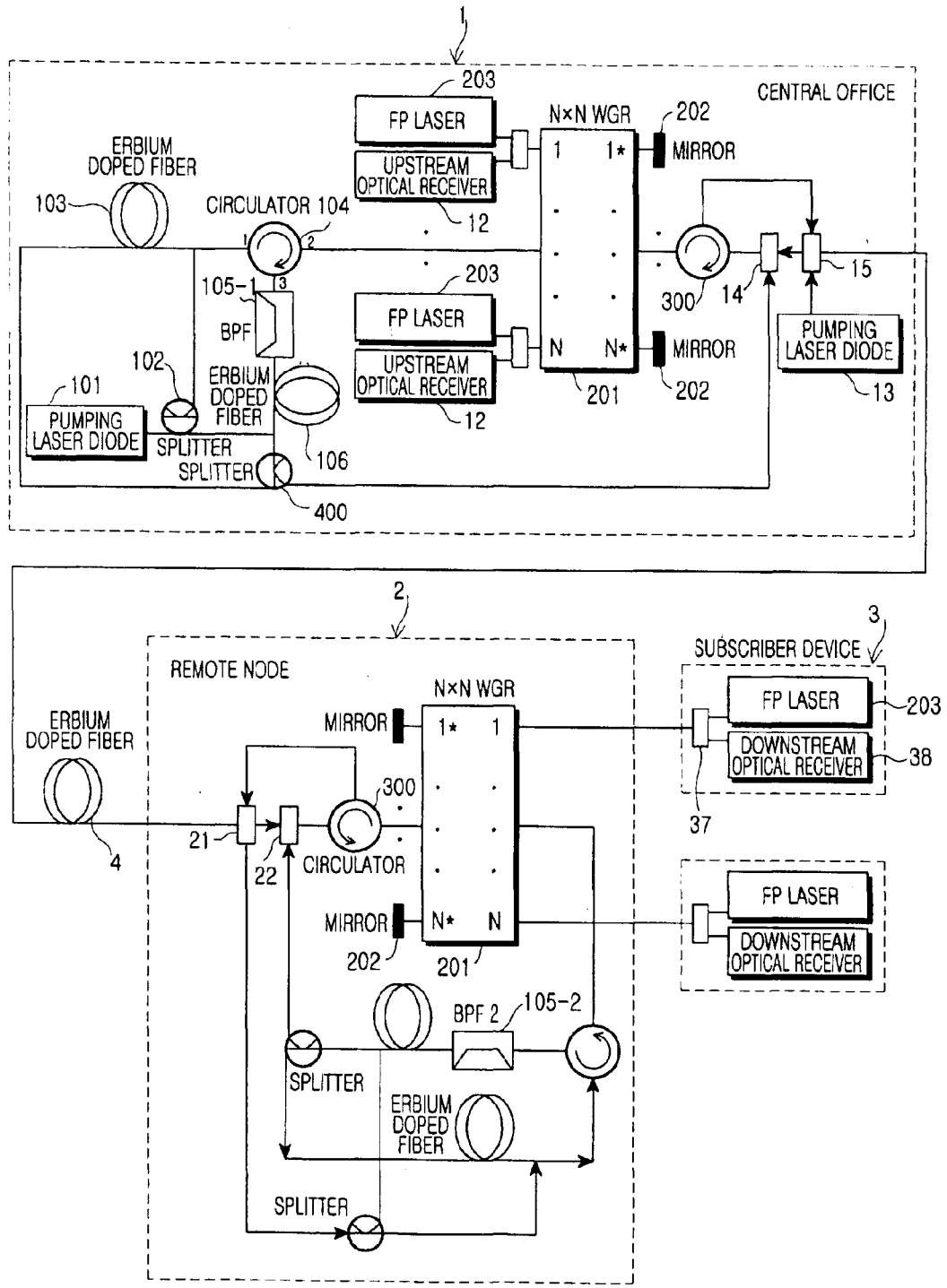
FIG. 4 illustrates a configuration of an optical transmission apparatus using the FP laser apparatus mode-locked to the multi-frequency lasing light source in accordance with a first embodiment of the present invention.

FIG. 4 illustrates an embodiment of signal transmission of a WDM-based PON using the FP laser apparatus mode-locked to the multi-frequency lasing light source of the present invention. The PON of this embodiment includes a central office 1, a remote node 2 and a plurality of subscriber devices 3 connected to a transmission optical fiber.

The central office 1 includes a light source of the present invention using FP lasers mode-locked to the multi-frequency lasing light source as illustrated in FIG. 1; N–1 second wavelength division multiplexers/demultiplexers 11 connected to N–1 FP lasers 203, which are connected to the WGR 201; N–1 number of upstream optical receivers 12 for receiving channel signals of subscribers; a pumping laser diode 13 for outputting a pumping signal driving the light sources of the present invention arranged at the remote node 2 and a subscriber device 3; and second and third wavelength division multiplexers/demultiplexers 14 and 15 for multiplexing/demultiplexing upstream/downstream signals and the pumping signal.

The remote node 2 comprises the light source of the present invention except for N–1 number of FP lasers; and fourth and fifth wavelength division multiplexers/demultiplexers 21 and 22 for multiplexing/demultiplexing the upstream/downstream signals and the pumping signal.

The subscriber device 3 comprises an FP laser 203 mode-locked to a signal provided from the remote node 2; a downstream optical receiver 38 for receiving a downstream channel signal demultiplexed by the remote node 2; and a sixth wavelength division multiplexer/demultiplexer 37 for multiplexing/demultiplexing input/output signals of the FP laser 203 and a downstream channel inputted by the downstream optical receiver 38.

An embodiment of a PON based on a WDM using the light source of the present invention with the above-descried configurations is now described.

Referring to FIG. 4, the multiplexed signals outputted from the multi-frequency lasing light source arranged at the central office 1 are inputted through the second wavelength division multiplexer/demultiplexer 14 and the circulator 300 to be demultiplexed. The demultiplexed channels are inputted into the FP laser 203 through the first wavelength division multiplexer/demultiplexer 11, and the FP laser 203 outputs, for transmission, directly modulated mode-locked signals based on downstream data. The mode-locked signals are re-inputted into the WGR 201 through the first wavelength division multiplexer/demultiplexer 11 to be multiplexed. The multiplexed signals are inputted into the third wavelength division multiplexer/demultiplexer 14 through the circulator 300, and the multiplexed signals along with a signal outputted from the pumping laser diode 13 for driving an upstream multi-frequency lasing light source are multiplexed. The multiplexed signals are transmitted to the remote node 2 through the transmission optical fiber 4. The multiplexed downstream signals outputted to the remote node 2 and the pumping laser signal are demultiplexed by the fourth wavelength division multiplexer/demultiplexer 21. The pumping laser signal drives an upstream multi-frequency lasing light source. The downstream signals are inputted into the WGR through the fifth wavelength multiplexer/demultiplexer 22 and the circulator to be demultiplexed. The demultiplexed downstream channels are inputted into the downstream optical receiver 38 of the subscriber device 3 to be detected as electrical signals.

The multiplexed signals outputted from the upstream lasing light source arranged in the remote node 2 are inputted into the WGR through the fifth wavelength division multiplexer/demultiplexer 22 and the circulator 300 to be demultiplexed. The demultiplexed channels are inputted into the FP laser 203 through the sixth wavelength division multiplexer/demultiplexer 37 of the subscriber device 3. The FP laser 203 outputs directly modulated mode-locked signals based on upstream data to be transmitted. The mode-locked signals are re-inputted into the WGR arranged in the remote node 2 through the sixth wavelength division multiplexer/demultiplexer 37 to be multiplexed. The multiplexed upstream signals are transmitted to the central office 1 through the circulator 300, the fourth wavelength division multiplexer/demultiplexer 21 and the transmission optical fiber 4. The upstream signals inputted into the central office 1 are inputted into the WGR 201 through the third wavelength division multiplexer/demultiplexer 15, the second wavelength division multiplexer/demultiplexer 14 and the circulator 300 to be demultiplexed. The demultiplexed upstream channels are inputted into the upstream optical receiver 12 through the first wavelength division multiplexer/demultiplexer 11 to be detected as electrical signals.

Referring to FIG. 4, the PON based on the WDM using the light source of the present invention simultaneously transmits upstream and downstream signals using the one transmission optical fiber 4. Thus, BPFs 105-1 and 105-2 having different center wavelengths are used for a downstream multi-frequency lasing light source and an upstream multi-frequency lasing light source so that a wavelength band of an upstream signal and a wavelength band of a downstream signal can be separated.

Figure 5:
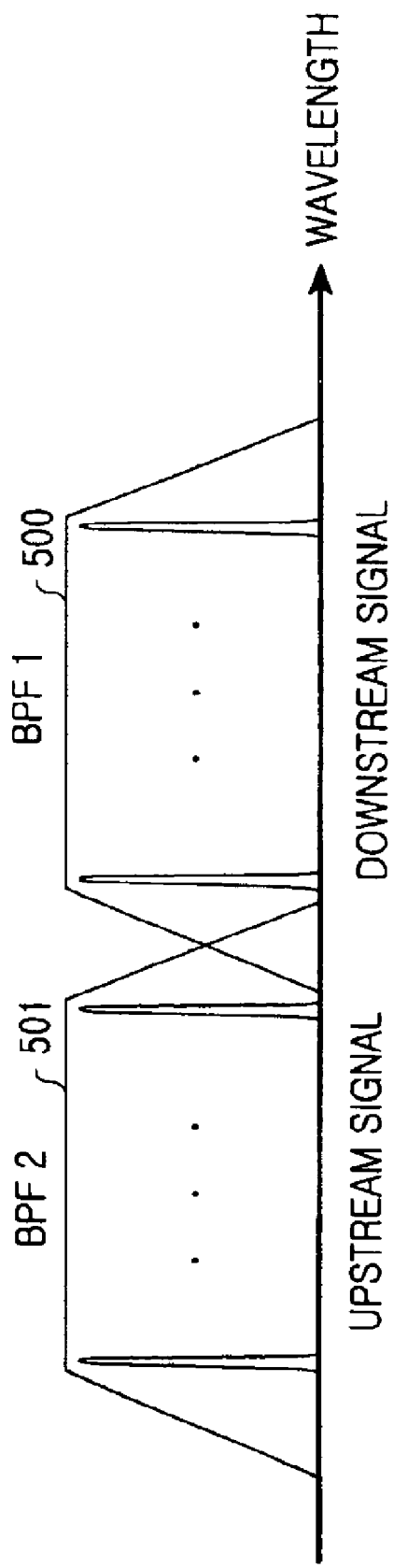
FIG. 5 illustrates bandpass characteristics of a first bandpass filter and a second bandpass filter shown in FIG. 4.

FIG. 5 illustrates bandpass characteristics 500 of the first BPF 105-1 used for the downstream multi-frequency lasing light source and 501 the second BPF 105-2 used for the upstream multi-frequency lasing light source. Bands of the first and second BPFs are the same as one free spectral range of the WGR, respectively. A central wavelength interval is one free spectral range or more. Thus, wavelength bands of the upstream and downstream signals are not overlapped.

Figure 6A:
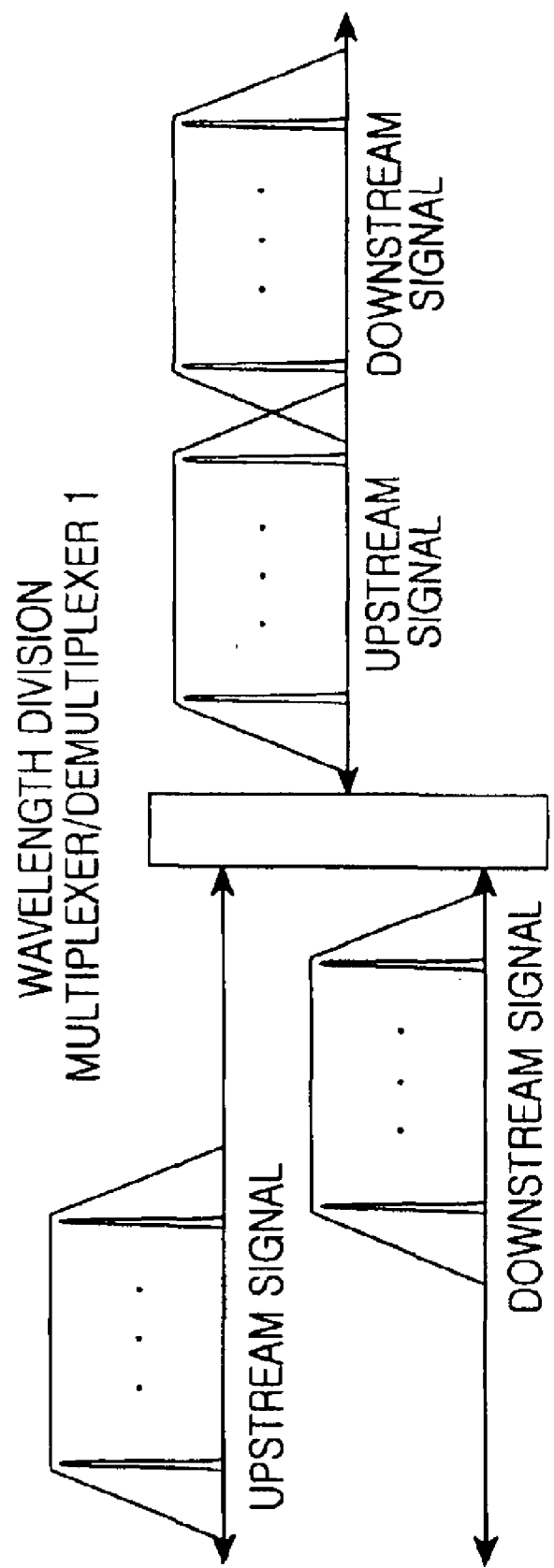
FIGS. 6A and 6B illustrate bandpass characteristics of wavelength division multiplexers/demultiplexers used in the optical transmission apparatus in accordance with a first embodiment of the present invention.
Figure 6B:
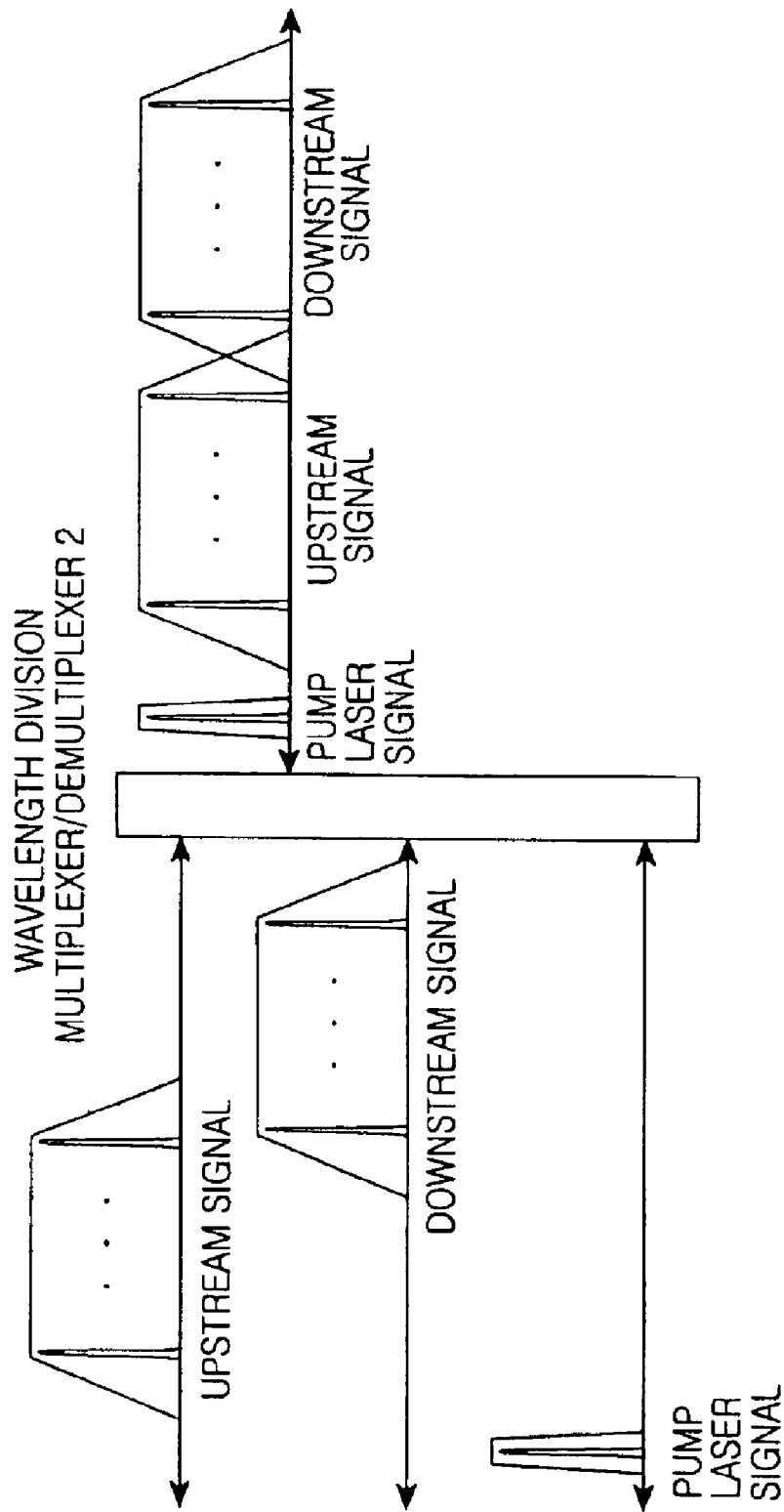

FIG. 6A illustrates bandpass characteristics of the second and fifth wavelength division multiplexers/demultiplexers 14 and 22, and FIG. 6B illustrates bandpass characteristics of the third and fourth wavelength division multiplexers/demultiplexers 15 and 21. Since the second and fifth wavelength division multiplexers/demultiplexers 14 and 22 multiplex/demultiplex upstream and downstream signals, they are configured by a combination of the first and second BPFs 105-1 and 105-2. Further, since the third and fourth wavelength division multiplexers/demultiplexers 15 and 21 multiplex/demultiplex the upstream and downstream signals and the pumping laser signal for driving the upstream multi-frequency lasing light source, they are configured by a combination of the first and second BPFs and a BPF corresponding to a wavelength of the pumping laser signal.

Figure 7:
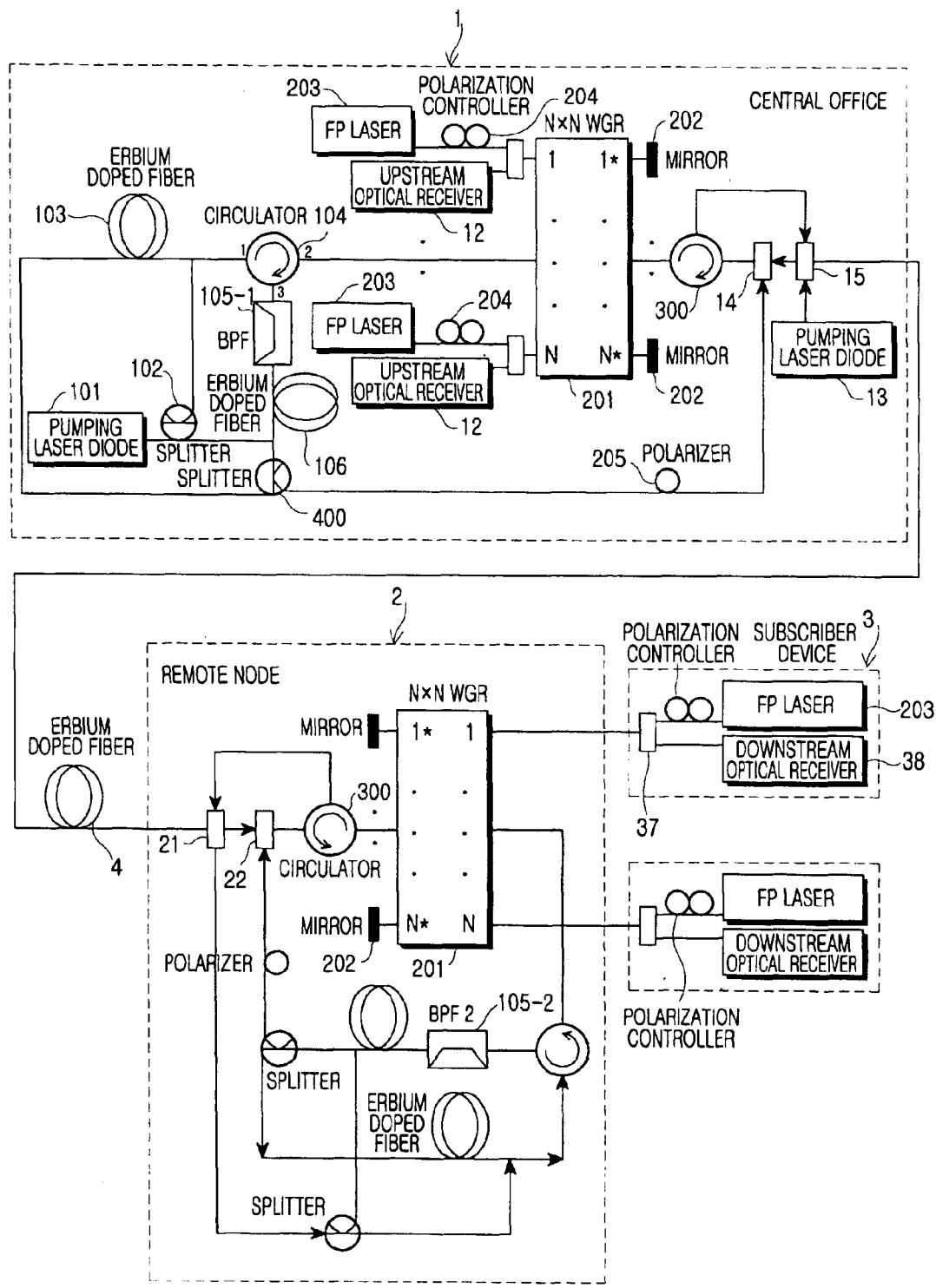
FIG. 7 illustrates a configuration of an optical transmission apparatus in accordance with a second embodiment of the present invention.

FIG. 7 illustrates a configuration of the PON based on the WDM using the FP laser apparatus (FIG. 3) mode-locked to a multi-frequency lasing light source in accordance with the second embodiment of the present invention. Other configurations of the PON based on the WDM using the FP laser apparatus are illustrated in FIGS. 4 and 7 and are the same except that the PON shown in FIG. 7 further comprises PCs 204 and a polarizer 205 as compared with the PON shown in FIG. 4.

As apparent from the above description, the present invention provides an FP laser apparatus mode-locked to a multi-frequency lasing light source capable of efficiently performing a mode lock of an FP laser using a multi-frequency lasing light source generating a wavelength division multiplexed signal with very narrow line width having high output power, and performing direct modulation based on a high-speed data signal using an inexpensive FP laser without use of an expensive external modulator.

The present invention generates a multiplexed signal equal to a wavelength band of a WGR and adjusts a wavelength band by adjusting a operating temperature of a WGR, thereby controlling a wavelength band of a wavelength division multiplexed signal drawn to a transmission link. Thus, wavelength stabilization and wavelength selectivity of FP lasers are not needed.

The present invention can minimize the number of WGRs used in a PON based on WDM by organizing a multi-frequency lasing light source generating upstream/downstream signals using one WGR arranged in each of a central office and a remote node and simultaneously multiplexing/demultiplexing the upstream/downstream signals, and can minimize the number of optical fibers by simultaneously transmitting the upstream/downstream signals using one transmission optical fiber.

According to the above-described advantages, the present invention can be used to implement an FP laser apparatus mode-locked to a cost-effective and efficient multi-frequency lasing light source and can be used to implement a PON based on the WDM.

Although the preferred embodiments of the present invention have been disclosed for illustrative purposes, those skilled in the art will appreciate that various modifications, additions and substitutions are possible, without departing from the scope of the invention. Therefore, the present invention is not limited to the above-described embodiments, but the present invention is defined by the claims which follow, along with their full scope of equivalents.

What is claimed is:

1. A Fabry-Perot (FP) laser apparatus mode-locked to a multi-frequency lasing light source as a light source for Wavelength Division Multiplexing WDM-based optical communications, comprising:

an optical amplifier that amplifies inputted optical signals;

a laser light source that wavelength division demultiplexes a first part of the inputted optical signals, multiplexes the demultiplexed optical signals, re-transmits the multiplexed optical signals, wavelength division demultiplexes the remaining part of the amplified optical signals, and outputs signals mode-locked to the demultiplexed signals; and a first circulator that inputs the remaining part of the amplified optical signals into the laser light source, and outputs, to an optical transmission link, optical signals mode-locked to the multi-frequency lasing light source outputted from the laser light source.

2. The FP laser apparatus of claim 1, wherein the laser light source comprises:

a wavelength division multiplexing/demultiplexing device, having one multiplexing port and N−1 demultiplexing ports arranged in each of a first and second side of the device, that wavelength division demultiplexes the optical signals inputted into the multiplexing port and outputs the demultiplexed signals, and wavelength division multiplexes the optical signals inputted into the N−1 demultiplexing ports and outputs the multiplexed signals;

N−1 reflection mirrors, connected to the second-side demultiplexing ports of the wavelength division multiplexing/demultiplexing device, that reflect the demultiplexed signals and re-input the demultiplexed signals into the second-side demultiplexing ports of the wavelength division multiplexing/demultiplexing device; and N−1 FP lasers, connected to the first-side demultiplexing ports of the wavelength division multiplexing/demultiplexing device, that output the signals mode-locked to the demultiplexed signals.

3. The FP laser apparatus of claim 1, wherein the optical amplifier comprises:

a first and second amplifying fiber that amplify the inputted optical signals using stimulated emission of a rare earth element;

a pumping light source that outputs pumping light of a predetermined wavelength for pumping the first and second amplifying fiber;

a second splitter that partially splits the pumping light, couples the partially split pumping light to the first amplifying fiber, and couples the remaining pumping light to the second amplifying fiber; and a second circulator having a first, second and third port that receive the optical signals amplified by the first amplifying fiber from the first port and outputs the amplified optical signals to the laser light source connected to the second port, and receives the wavelength division multiplexed signals, outputted from the laser light source, from the second port and outputs the multiplexed signals to the second amplifying fiber connected to the third port.

4. The FP laser apparatus of claim 3, wherein the optical amplifier further comprises a first bandpass filter, arranged between the third port of the second circulator and the second amplifying fiber, having the same bandwidth as the output wavelength division multiplexed optical signals, wherein, signals outside of the bandwidth are removed.

5. The FP laser apparatus of claim 3, wherein the rare earth element is erbium.

6. The FP laser apparatus of claim 2, wherein the wavelength division multiplexing/demultiplexing device is an N×N waveguide grating router.

7. The FP laser apparatus of claim 2, further comprising:
N−1 polarization controllers connected between the N−1 FP lasers and the wavelength division multiplexing/demultiplexing device; and
a polarizer connected to the first circulator and the first splitter.

8. A Passive Optical Network (PON) based on Wavelength Division (WDM) multiplexing comprising:
a central office having a Fabry-Perot (FP) laser apparatus according to claim 2 as a light source;
a remote node having a Fabry-Perot (FP) laser apparatus according to claim 2 configured as a multi-frequency lasing light source and connected to the central office through a transmission optical fiber; and
a plurality of subscriber devices that are connected through a transmission optical fiber to the remote node.

9. The PON of claim 8, further comprising a plurality of polarization controllers and a polarizer installed in the central office and between the remote node and the subscriber devices, wherein the efficiency of a mode lock of the FP lasers is improved.

10. The PON of claim 8, wherein the light source arranged in the central office and the multi-frequency lasing light source arranged in the remote node further comprise a first and second bandpass filter having different wavelength passbands such that wavelength bands of an upstream and a downstream signal are different.

11. An optical transmission apparatus for transmitting upstream and downstream signals of a PON (Passive Optical Network) in which a central office, a remote node and a plurality of subscriber devices are connected through a transmission optical fiber, comprising:
the central office comprising
a light source having FP lasers outputting signals for transmission that are mode-locked to multi-frequency lasing light and directly modulated based on downstream data,
a circulator connected to the light source that downstream-transmits the signals mode-locked to the multi-frequency lasing light and directly modulated, and outputs optical signals for upstream-transmission from the remote node to the transmission optical fiber,
a plurality of upstream optical receivers that receive the upstream-transmitted optical signals,
a plurality of first wavelength division multiplexers/demultiplexers that multiplex/demultiplex input/output signals of the FP lasers and upstream channels for input into the upstream optical receivers,
a pumping light source that outputs pumping light of a predetermined wavelength to drive the upstream multi-frequency lasing light source, and
a second and third wavelength division multiplexers/demultiplexers that multiplexes/demultiplexes the upstream/downstream-transmitted signals and a pumping signal;
the remote node comprising
a multi-frequency lasing light source having an N×N waveguide grating router that demultiplexes the multiplexed downstream signals for transmission and the multi-frequency lasing light and multiplexes optical signals transmitted from the subscriber devices, and
a fourth and fifth wavelength division multiplexer/demultiplexer that multiplexes/demultiplexes the upstream/downstream-transmitted signals and the pumping signal; and
the subscriber devices each comprising
an FP laser that receives the optical signals transmitted from the remote node and outputs for transmission directly modulated mode-locked signals based on upstream data,
a downstream optical receiver that receives downstream channel signals demultiplexed and transmitted by the remote node, and
a sixth wavelength division multiplexer/demultiplexer that multiplexes/demultiplexes input/output signals of the FP laser and downstream channels for input into the downstream optical receiver.

12. The optical transmission apparatus of claim 11, wherein the light source having the FP lasers outputting signals mode-locked to multi-frequency lasing light and directly modulated, comprises:
an optical amplifier that amplifies inputted optical signals;
a laser light source that wavelength division demultiplexes a part of the inputted optical signals, multiplexes the demultiplexed optical signals, re-transmits the multiplexed optical signals, wavelength division demultiplexes a remaining part of the amplified optical signals, and outputs signals mode-locked to the demultiplexed signals; and
a first circulator that inputs the remaining part of the amplified optical signals into the laser light source, and outputs, to an optical transmission link, optical signals mode-locked to the multi-frequency lasing light source outputted from the laser light source.

13. The optical transmission apparatus of claim 11, wherein the light source arranged in the central office and the multi-frequency lasing light source arranged in the remote node comprise a first and second bandpass filter having different wavelength passbands such that wavelength bands of the upstream and downstream signals are different.

14. The optical transmission apparatus of claim 13, wherein the first and second bandpass filter have the same passband as one free spectral range of the waveguide grating router, and center wavelengths of the first and second bandpass filters are separated by at least one free spectral range.

15. The optical transmission apparatus of claim 13, wherein the second and fifth wavelength division multiplexer/demultiplexer are configured to pass signals of a passband of the first bandpass filter and a passband of the second bandpass filter.

16. The optical transmission apparatus of 13, wherein the third and fourth wavelength division multiplexer/demultiplexer are configured to pass signals of a passband of the first bandpass filter and a passband of the second bandpass filter and the pumping signal from the central office.

17. The optical transmission apparatus of claim 11, further comprising a plurality of polarization controllers and a polarizer installed in the central office and between the remote node and the subscriber devices, wherein the efficiency of a mode lock of the FP lasers is improved.

* * * * *